(12) United States Patent
Solomon (10) Patent No.: US 9,742,187 B2
(45) Date of Patent: Aug. 22, 2017

(54) POWER SUPPLY CIRCUIT WITH ACTIVE UNDER-VOLTAGE PROTECTION

(71) Applicant: Siemens Canada Limited

(72) Inventor: Salim Solomon, Thornhill (CA)

(73) Assignee: Siemens Canada Limited, Oakville, Ontario (CA)

( * ) Notice: Subject to any disclaimer, the term of this patent is extended or adjusted under 35 U.S.C. 154(b) by 0 days.

(21) Appl. No.: 15/303,768

(22) PCT Filed: Feb. 10, 2015

(86) PCT No.: PCT/CA2015/050092
§ 371 (c)(1),
(2) Date: Oct. 13, 2016

(87) PCT Pub. No.: WO2015/157857
PCT Pub. Date: Oct. 22, 2015

(65) Prior Publication Data
US 2017/0040797 A1    Feb. 9, 2017

Related U.S. Application Data

(60) Provisional application No. 61/979,150, filed on Apr. 14, 2014.

(51) Int. Cl.
*H02M 1/10* (2006.01)
*H02J 1/00* (2006.01)
*G01R 19/00* (2006.01)
*H02H 3/24* (2006.01)
*H02M 1/32* (2007.01)
*H02M 7/04* (2006.01)

(52) U.S. Cl.
CPC ............ *H02J 1/00* (2013.01); *G01R 19/0084* (2013.01); *H02H 3/24* (2013.01); *H02M 1/10* (2013.01); *H02M 1/32* (2013.01); *H02M 7/04* (2013.01)

(58) Field of Classification Search
CPC ................... H02J 1/10; H02J 1/32; H02J 7/04
USPC .......................................................... 307/85
See application file for complete search history.

(56) References Cited

U.S. PATENT DOCUMENTS

| 5,001,623 A | 3/1991 | Magid |
| 5,534,768 A | 7/1996 | Chavannes et al. |
| 5,847,545 A | 12/1998 | Chen et al. |
| 7,768,247 B2 | 8/2010 | Sasaki et al. |
| 7,957,113 B2 | 6/2011 | Yamamoto |

OTHER PUBLICATIONS

PCT Search Report dated May 4, 2015 corresponding to PCT Application No. PCT/CA2015/050092 filed Feb. 10, 2015 (8 pages).

*Primary Examiner* — Robert Deberadinis (57) ABSTRACT

A power supply circuit includes a protection circuit interconnected with an input voltage to the power supply. The protection circuit includes a detection circuit to detect whether a magnitude of the input voltage is below a defined threshold. The detection circuit comprises a plurality of detectors, each for detecting for a defined voltage waveform, whether its magnitude is below a defined threshold voltage. Logic interconnects the detection circuit to provide a control signal for inhibiting the power supply from providing said output voltage if the input voltage is below the defined threshold for that defined voltage waveform, as detected by the detection circuit.

14 Claims, 6 Drawing Sheets

POWER SUPPLY CIRCUIT WITH ACTIVE UNDER-VOLTAGE PROTECTION

CROSS-REFERENCE TO RELATED APPLICATIONS

The present application claims benefits from U.S. Provisional Patent Application No. 61/979,150, filed Apr. 14, 2014.

TECHNICAL FIELD

This relates to power supplies, and more particularly to power supplies that provide for under-voltage protection.

BACKGROUND

Electronic power supplies, used in a variety of applications, typically provide a defined (often regulated) voltage to downstream components. Power supplies are used in most modern electronic and electric applications to allow circuits to be designed to operate at voltages that do not equal voltages provided by existing power sources (e.g. batteries; mains voltages; etc.).

Often power supplies are fused, and include over-current protection.

At the same time, the deleterious effects of under-voltage have been recognized. In particular, under-voltage has been a recognized problem in battery powered devices and power applications, where under-voltage may cause malfunctions in circuitry, and the loss of data stored in memory. Typically, however, under-voltage protection circuits are specific to a defined voltage source.

Accordingly, there remains a need for a generalized under-voltage protection circuit and power supply.

SUMMARY

As disclosed, a power supply circuit includes a protection circuit interconnected with an input voltage to the power supply. The protection circuit includes a detection circuit to detect whether a magnitude of the input voltage is below a defined threshold. The detection circuit includes a plurality of detectors, each for detecting for a defined voltage waveform, whether its magnitude is below a defined threshold voltage for that defined voltage waveform. Logic interconnects the detection circuit to provide a control signal for inhibiting the power supply from providing said output voltage if the input voltage is below the defined threshold for the defined voltage waveform, as detected by the detection circuit.

According to an aspect, there is provided a power supply circuit comprising a primary power supply for providing an output voltage from an input voltage; and a protection circuit interconnected with the input voltage. The protection circuit comprises a detection circuit to detect whether a magnitude of said input voltage is below a defined threshold. The detection circuit comprises a plurality of detectors each for detecting for a defined voltage waveform, whether its magnitude is below a defined threshold voltage. The logic is interconnected with the detection circuit to provide a control signal for inhibiting said primary power supply from providing its output voltage if the input voltage is below said defined threshold, as detected by the detection circuit.

According to another aspect, there is provided a method of operating a power supply circuit comprising a primary power supply and an auxiliary power supply. The method receiving an input voltage; using at least one active component powered by the auxiliary power supply to detect for a plurality of defined input voltage waveforms, whether a measure of the input voltage is below a defined threshold; and providing a control signal for inhibiting a primary power supply from providing its output voltage if the input voltage is below said threshold, as detected by the active component.

Other features will become apparent from the drawings in conjunction with the following description.

BRIEF DESCRIPTION OF THE DRAWINGS

In the figures which illustrate example embodiments.

DETAILED DESCRIPTION

Figure 1:
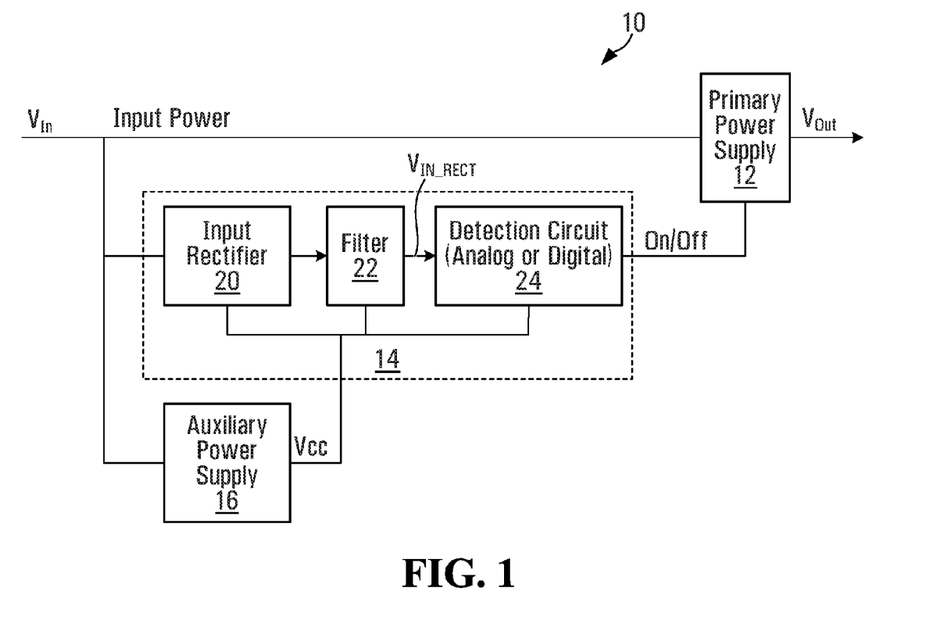
FIG. 1 is a block diagram of a power supply, exemplary of an embodiment of the present invention.

FIG. 1 is a schematic block diagram of an example power supply circuit 10, exemplary of an embodiment of the present invention. As illustrated, power supply circuit 10 includes a primary power supply 12, a protection circuit 14, and an auxiliary power supply 16.

Primary power supply 12 may be a conventional power supply circuit and may, for example, be an AC to DC supply, including a transformer rectifier and filter (all not shown) and optionally a voltage regulator (also not shown) to output a defined DC voltage. In alternate embodiments, primary power supply 12 could take the form of an AC power supply including the transformer and possibly a filter. Primary power supply 12 may also be a switched power supply or any other suitable power supply circuit. Primary power supply 12, however, relies on an input voltage $V_{IN}$, to produce the defined $V_{OUT}$. Depending on the nature of primary power supply 12, the input voltage may be an AC (sinusoid), DC or modified sine waveform voltage, or other waveform. Optionally, primary power supply 12 may be capable of operating with a multitude of source voltages having one of several different characteristic waveforms. Example voltage waveforms ($V_{IN\_DC}$, $V_{IN\_AC}$ and $V_{IN\_MOD}$) that may be provided as $V_{IN}$ to provide to primary power supply 12 are depicted in FIG. 3A-C.

Figure 3A:
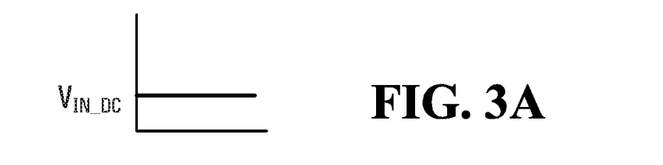
FIG. 3 illustrates example voltage waveforms that may be provided to the power supply of FIG. 1.
Figure 3B:
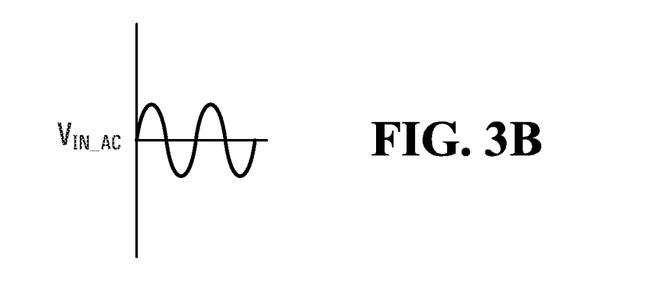
Figure 3C:
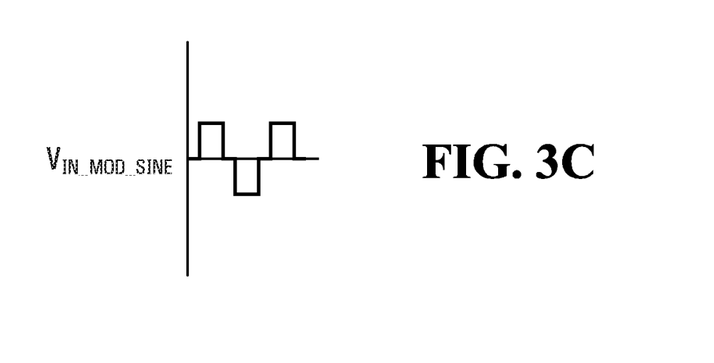

In particular, FIG. 3A depicts a time domain plot of a conventional DC input. FIG. 3B depicts a time domain plot of a standard AC (sine wave) input. FIG. 3C depicts a time-domain plot of a "modified sine wave". As will be appreciated, a modified sine wave is a periodic waveform typically produced by a switching power supply and has three different output levels: a maximum, a minimum, and an intermediate value between the maximum and the minimum. The modified sine wave cycles between the maximum and minimum values once per cycle, like a square wave. However, unlike a square wave which transitions between maximum and minimum values nearly instantaneously, a modified sine wave spends some finite duration at its intermediate value before transitioning to the next peak value. The intermediate value is typically zero, and the maximum and minimum values are of equal amplitude, and within each cycle the duration spent at the maximum and minimum value is the same. The output levels, frequency, and duty cycle of a modified sine wave may be chosen so as to provide an approximation of a particular sinusoid suitable for a chosen application. For example, the parameters may be chosen to provide identical peak voltage and RMS voltage to a particular sinusoid.

In order to provide an output voltage of the desired magnitude $V_{OUT}$, the magnitude of the input voltage, $V_{IN}$ must exceed some value $V_{SAFE}$. In the presence of an input voltage below this value (an under-voltage) primary power supply 12, unless protected, may not function properly and may ultimately be damaged or damage downstream circuitry. As will be appreciated, $V_{SAFE}$ may differ depending on the characteristic waveform of the input voltage.

As such, primary power supply 12 may be prevented from switching ON if the input voltage is less than $V_{SAFE}$. Likewise, once primary power supply is ON, if the input voltage drops below $V_{SAFE}$, primary power supply 12 may be turned OFF.

As will be appreciated, in order to prevent primary power supply 12 from oscillating between ON and OFF states, a threshold voltage $V_{THRESHOLD\_ON}$ and $V_{THRESHOLD\_OFF}$ may be chosen above and below at which primary power supply 12 will turn ON and OFF, respectively, with $V_{SAFE} \geq V_{THRESHOLD\_ON} > V_{THRESHOLD\_OFF}$. This may ensure that primary power supply 12 does not turn ON and OFF continuously if the input voltage is too close to $V_{THRESHOLD\_ON}$.

As noted, $V_{SAFE}$ may have different values depending on the nature of the input waveform. Likewise $V_{THRESHOLD\_ON}$ and $V_{THRESHOLD\_OFF}$ may be chosen in dependence on the waveform of $V_{IN}$.

Power supply circuit 10 further includes protection circuit 14 which may include an input rectifier 20, filter 22 and an under-voltage detection circuit 24. Protection circuit 14 includes active components—analog or digital—capable of detecting under-voltage for a number of different input voltage waveforms.

An auxiliary power supply 16 powers protection circuit 14 and in particular the active components of protection circuit 14. Auxiliary power supply 16 may be a low voltage power supply, capable of operating at input voltages lower than $V_{THRESHOLD\_ON}$ and $V_{THRESHOLD\_OFF}$ to provide an output voltage $V_{CC}$, and may, for example, take the form of a switching power supply capable of being powered by any suitable input voltage waveform providing a relatively low operating voltage $V_{CC}$ to protection circuit 14 (e.g. 3, 5 or even 12 volts). The operating voltage provided by auxiliary power supply 16 is typically significantly lower than $V_{OUT}$, provided by primary power supply 12. Primary power supply 12 therefore suffers from an under-voltage condition well before auxiliary power supply 16.

Input rectifier 20 may take the form of a conventional full-wave rectifier formed, for example, by four diodes connected back to back. Filter 22 may remove high frequency noise from the rectified output provided by input rectifier 20. Filter 22 may, for example, be formed as a plurality of capacitors, a digital filter or the like. The output of filter 22, $V_{IN\_RECT}$, is provided to detection circuit 24.

Figure 2:
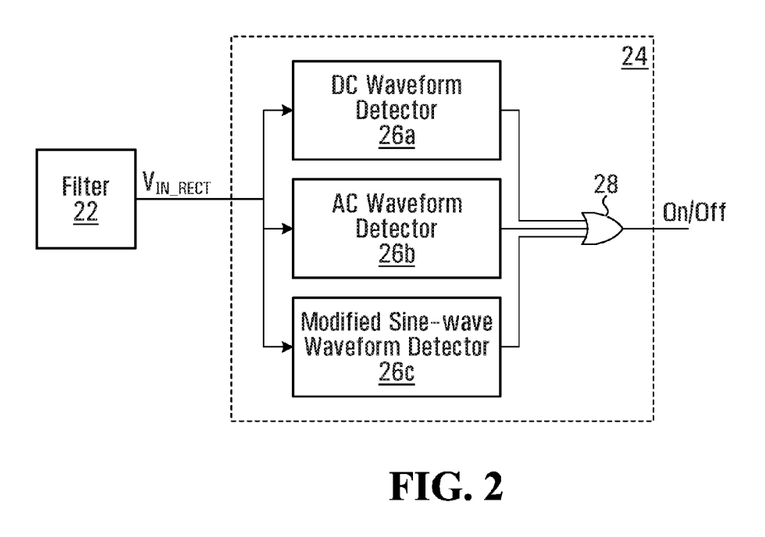
FIG. 2 is a block diagram of an example detection circuit of the power supply of FIG. 1.

Detection circuit 24 is further detailed in FIGS. 2 and 4A-4C. In particular, as illustrated in FIG. 2, detection circuit 24 may include multiple waveform detectors 26a, 26b, 26c (individually and collectively waveform detectors 26) that feed an OR-gate 28.

Waveform detectors 26 may operate in parallel in order to detect the nature of the input voltage provided to a detector 26, as well as a measure of its magnitude, and in particular, to assess if its magnitude is less than some defined threshold.

Figure 4A:
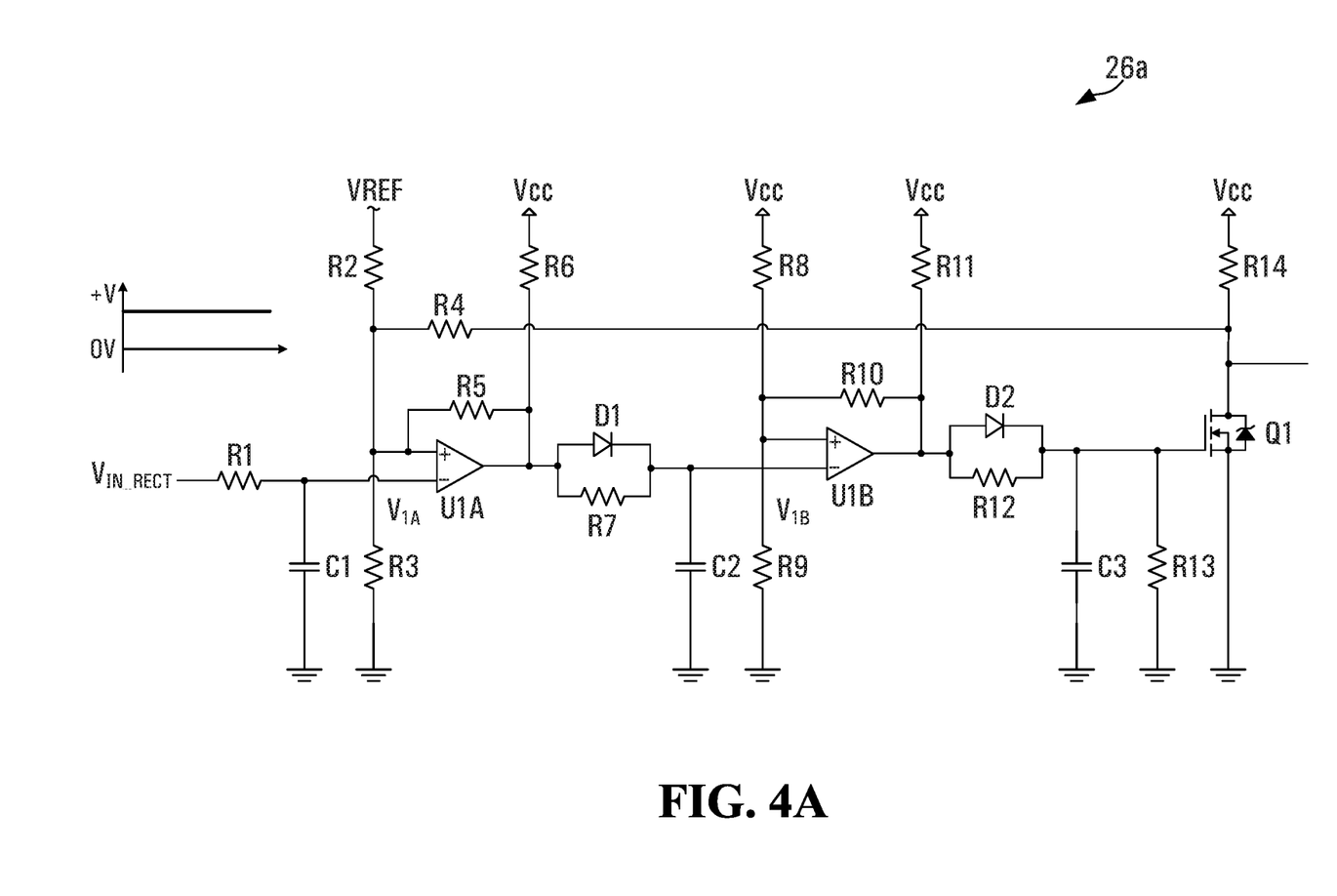
FIGS. 4A-4C are block diagrams of waveform specific detectors of the detection circuit of FIG. 2.
Figure 4B:
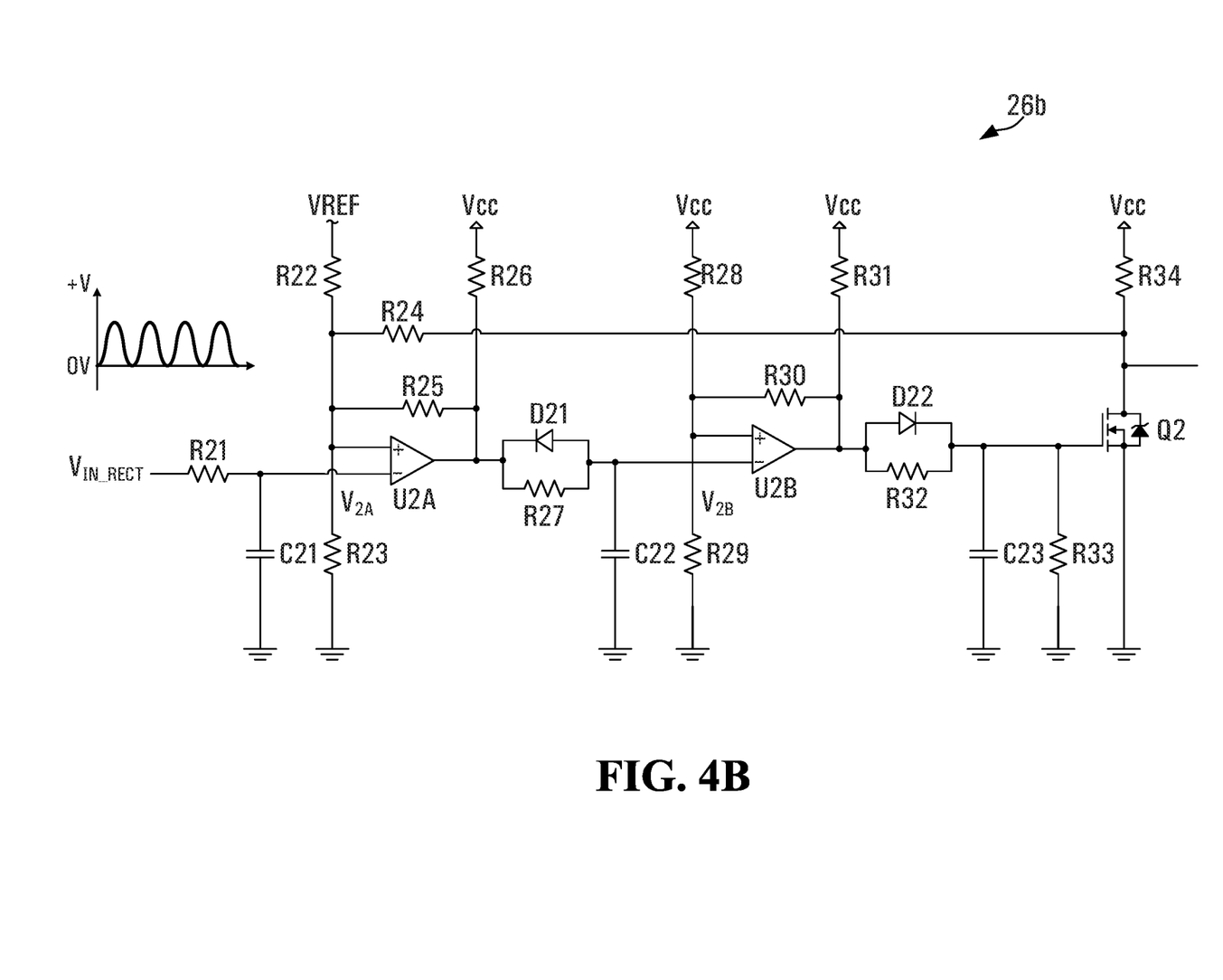
Figure 4C:
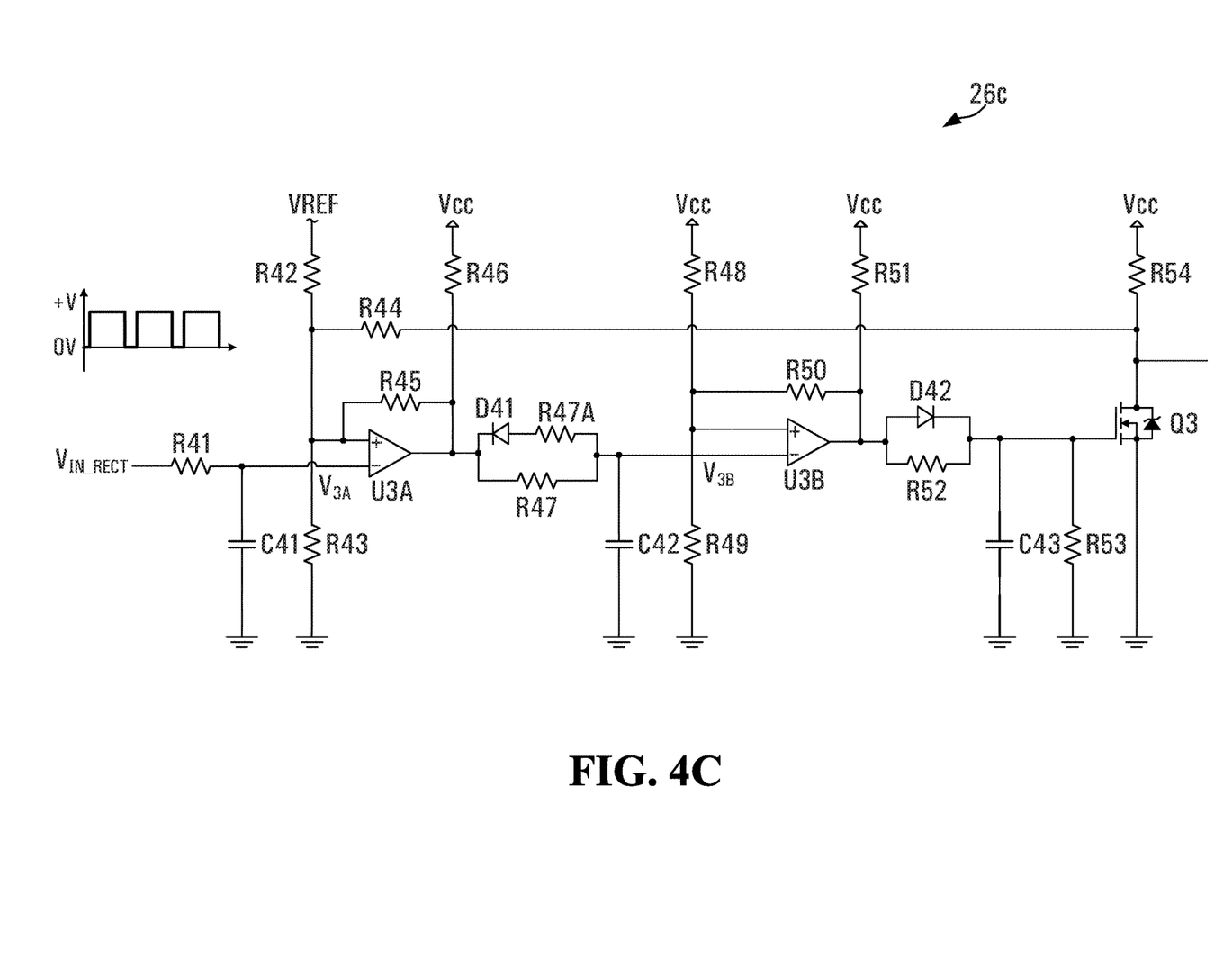

Example analog waveform detectors are schematically illustrated in FIGS. 4A-4C. FIG. 4A depicts a suitable waveform detector 26a for detecting a DC voltage (e.g. $V_{IN\_DC}$ of FIG. 3). FIG. 4B depicts a suitable waveform detector 26b for detecting an AC (e.g. sinusoidal) waveform (e.g. $V_{IN\_AC}$ of FIG. 3). FIG. 4C illustrates a detector 26c for detecting a modified sine waveform (e.g. ($V_{IN\_MOD\_SINE}$ of FIG. 3). Optionally, protection circuit 14 could include additional waveform detectors, for other supported input voltage waveform types.

As illustrated in FIG. 4A a DC waveform detector 26a includes two comparators U1A and U1B. Comparator U1A compares the input voltage as filtered by filter 22 to produce $V_{IN\_RECT}$, to a threshold voltage $V_{1A}$, presented at the non-inverting input of comparator U1A. R1 and C1 further filter the input to U1A. $V_{1A}$ is initially established by R2 and R3 and $V_{REF}$, as $V_{THRESHOLD\_ON\_DC}$. $V_{REF}$ may be provided by a regulated source, such as a regulator powered by auxiliary power supply 16. If the input voltage $V_{IN\_RECT}$ is less than this threshold, the output of comparator U1A will become low, outputting the saturation voltage of comparator U1A and discharging capacitor C2, through resistor R7. The output of comparator U1B remains ON (high) provided that the voltage of capacitor C2 remains lower than a second threshold voltage $V_{1B}$ (established by R8 and R9) presented at the non-inverting input of comparator U1B, thus charging capacitor C3 through resistor R12 and diode D2. Diode D1 prevents capacitor C2 from discharging into comparator U1A. Likewise, diode D2 prevents capacitor C3 from discharging into comparator U1B. $V_{1B}$ may be chosen in dependence on the saturation voltage of comparator U1B. Now, while the output of comparator U1B is high, transistor switch Q1 is turned ON, effectively connecting R4 to ground, in parallel with R3. R4 may be chosen so that $V_{1A}$ of U1A decreases to $V_{THRESHOLD\_OFF\_DC}$, thereby requiring the input voltage $V_{IN\_RECT}$ to drop below $V_{THRESHOLD\_OFF\_DC}$ for the output of comparator U1A to again become high, thereby turning OFF Q1. $V_{THRESHOLD\_ON\_DC}$ and $V_{THRESHOLD\_OFF\_DC}$ may be empirically determined for suitable threshold ON and OFF voltages for $V_{IN}$, when $V_{IN}$ is a constant DC voltage (i.e. DC waveform). R4, R5, R6, R10, R11 and R14 are typical biasing resistors used as in conventional comparator circuits.

As illustrated in FIG. 4B an AC waveform detector 26b also includes two comparators U2A and U2B. Comparator U2A again compares the input voltage, as filtered by filter 22 to a threshold voltage $V_{2A}$ presented at the non-inverting input of comparator U2A. R21 and C21 further filter the input to U2A. $V_{2A}$ is initially established by R22 and R23 and $V_{REF}$, as $V_{THRESHOLD\_ON\_AC}$. $V_{REF}$ may be the same $V_{REF}$ provided to waveform detector 26a, such as a regulator powered by auxiliary power supply 16. If the input voltage to comparator U2A is less than this threshold, the output of comparator U2A will become low, outputting the saturation voltage of comparator U2A and discharging capacitor C22, through diode D21. Resistor R27 and capacitor C22 are chosen so that their RC constant is relatively high, requiring the input to U2A, $V_{IN\_RECT}$, to be below $V_{THRESHOLD\_ON\_AC}$ for some time before charging— thereby filtering small dips in $V_{IN\_RECT}$. The output of comparator U2B remains ON (high) provided that the voltage of capacitor C22 remains lower than a second threshold voltage $V_{2B}$ (established by R28 and R29) presented at the non-inverting input of comparator U2B, thus charging capacitor C23 through resistor R32 and diode D22. Diode D21 and resistor R27 allow capacitor C22 to discharge quickly into comparator U2A as U2A provides a low output (signifying $V_{IN\_RECT} > V_{THRESHOLD}$). Diode D22 prevents capacitor C23 from discharging into comparator U2B. $V_{2B}$ may be chosen in dependence on the saturation voltage of comparator U2A. Again, while the output of comparator U2B is high, transistor switch Q2 is turned ON effectively connecting R24 to ground, in parallel with R23. R24 may be chosen so that if $V_{2A}$ of U2A decreases to $V_{THRESHOLD\_OFF\_AC}$, thereby requiring the input voltage $V_{IN\_RECT}$ to drop below $V_{THRESHOLD\_OFF\_AC}$ for the output of comparator U2A to again become low, thereby turning OFF Q2. Again, $V_{THRESHOLD\_ON\_AC}$ and $V_{THRESHOLD\_OFF\_AC}$ may be empirically determined for suitable threshold ON and OFF voltages for $V_{IN}$, when $V_{IN}$ is a sinusoidal AC waveform. R24, R25, R26, R30, R31 and R34 are typical biasing resistors used as in conventional comparator circuits.

As illustrated in FIG. 4C a modified sine waveform detector 26c includes two comparators U3A and U3B. Waveform detector 26c is well suited to detecting threshold voltages in a non-sinusoidal voltage waveform (e.g. a modified sine-wave waveform as depicted in FIG.). Comparator U3A again compares the input voltage as filtered by filter 22, $V_{IN\_RECT}$, to a threshold $V_{3A}$ presented at the non-inverting input of comparator U3A. R41 and C41 further filter the input to U3A. $V_{3A}$ is initially established by R42 and R43 and $V_{REF}$, as $V_{THRESHOLD\_ON\_MOD}$. $V_{REF}$ may again be the same $V_{REF}$ provided to waveform detectors 26a and 26b (such as by a regulator powered by auxiliary power supply 16). If the input voltage to comparator U3A is greater than this threshold, the output of comparator U3A will become low, discharging capacitor C42, through resistor R47A and diode D41. Capacitor C42 and R47 are chosen so that their RC constant is relatively high, allowing the input to U3A, $V_{IN\_RECT}$, to be below $V_{THRESHOLD}$ for some time before discharging—thereby filtering the off cycle in $V_{IN\_RECT}$. The output of comparator U3B remains ON (high) provided that the voltage of capacitor C42 remains lower than a second threshold voltage $V_{3B}$ (established by R48 and R49) presented at the non-inverting input of comparator U3B, thus charging capacitor C43 through resistor R52 and diode D32. Diode D41 and resistor R47 and R47A allow capacitor C42 to discharge quickly into comparator U3A as comparator U3A provides a low output (signifying $V_{IN\_RECT} > V_{THRESHOLD}$). Likewise, diode D32 prevents capacitor C43 from discharging into comparator U3B. $V_{3B}$ may be chosen in dependence on the saturation voltage of comparator U3A. Again, while the output of comparator U3B is high, transistor switch Q3 is turned ON effectively connecting R44 to ground, in parallel with R43. R44 may be chosen so that $V_{3A}$ of U3A decreases to $V_{THRESHOLD\_OFF\_MOD}$, thereby requiring the input voltage $V_{IN\_RECT}$ to drop below $V_{THRESHOLD\_OFF\_MOD}$ for the output of comparator U3A to again become low, thereby turning OFF Q3. Once again, $V_{THRESHOLD\_ON\_MOD}$ and $V_{THRESHOLD\_OFF\_MOD}$ may be empirically determined for suitable threshold ON and OFF voltages for $V_{IN\_RECT}$, when $V_{IN\_RECT}$ is a modified sine waveform. R44, R45, R46, R50, R51 and R54 are typical biasing resistors used as in conventional comparator circuits.

The outputs of detectors 26a, 26b and 26c are provided to logic—in the depicted embodiment in the form of a wired OR-gate 28 (FIG. 2). The output of OR-gate 28 then provides a control signal that enables or inhibits primary power supply 12. In particular, if none of detectors 26a, 26b, and 26c detect an input voltage having suitable magnitude (i.e. $V_{IN} < V_{THRESHOLD\_ON\_DC}$ OR $V_{IN} < V_{THRESHOLD\_ON\_AC}$ OR $V_{IN} < V_{THRESHOLD\_ON\_MOD}$) or, in steady state, if this measure drops below the threshold for a material time interval (i.e. $V_{IN} < V_{THRESHOLD\_OFF\_DC}$ OR $V_{IN} < V_{THRESHOLD\_OFF\_AC}$ OR $V_{IN} < V_{THRESHOLD\_OFF\_MOD}$), primary power supply 12 is disabled and no power is output by circuit 10. In this way, primary power supply 12, as well as downstream components powered by primary power supply 12 may be protected from under-voltage.

In an alternate embodiment, detection circuit 24 may be formed as a digital processing circuit, embodied in a digital signal processor (DSP), application specific integrated circuit (ASIC), general purpose processor, or the like. So implemented, circuit 24 may be suitably programmed with, for example, processor executable instructions stored in processor readable memory, to perform blocks S400 set forth in FIG. 5, performing generally similar to detectors 26a, 26b and 26c.

Figure 5:
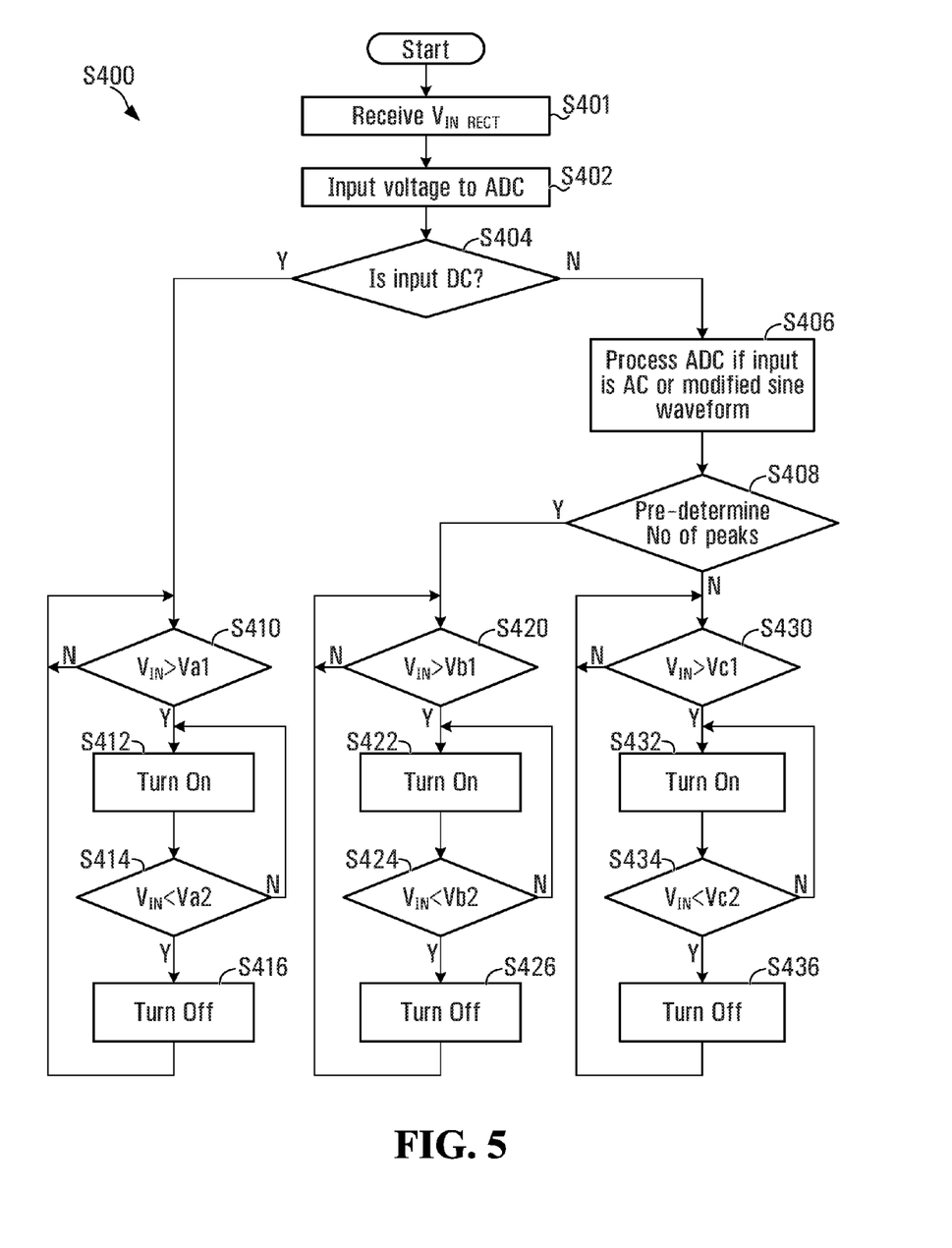
FIG. 5 is a flow chart performed by an alternate detection circuit.

As illustrated, input voltage $V_{IN\_RECT}$ is digitized in block S402. The nature of the input voltage is detected in blocks S404-S408. In particular, a DC voltage waveform is detected from the digitized voltage in block S404. If, the voltage is DC, blocks S410-S416 are performed (similar to detector 26a).

If the input voltage $V_{IN\_RECT}$ is not assessed to be DC waveform, the digitized signal is processed in block S406 to assess if it is an AC (sinusoidal) voltage, or a modified sine waveform. If, for example, the input voltage waveform has a predetermined number of peaks, it may be assessed to be an AC voltage waveform in block S408, and blocks S420-S426 may be performed (similar to detector 26b). If not, the voltage may be assessed to be a modified sine waveform and blocks S430-S436 may be performed (similar to detector 26c).

If the waveform is a DC voltage, a determination is made if the sampled DC voltage exceeds a threshold voltage $V_{a1}$ in block S410. If so, a power supply enable signal may be output in block S412, enabling primary power supply 12. The signal remains ON, as long as the $V_{IN\_RECT}$ remains greater than a second threshold voltage $V_{a2}$, as determined in block S414. If $V_{IN\_RECT}$ falls below the second threshold voltage $V_{a2}$, the primary power supply enable signal may be inhibited in block S416, turning OFF primary supply 12.

Similarly, if the waveform is an AC (sinusoidal) voltage, a determination is made if the sampled AC voltage exceeds a threshold voltage $V_{b1}$ in block S420. If so, a primary power supply enable signal may be output in block S422. The signal remains ON, as long as the $V_{IN\_RECT}$ remains greater than a second threshold voltage $V_{b2}$, as determined in block S424. If $V_{IN\_RECT}$ falls below the second threshold voltage $V_{b2}$, the primary power supply enable signal may be inhibited in block S426, turning OFF primary supply 12.

Likewise, if the waveform is a modified sine waveform voltage, a determination is made if the sampled wave voltage exceeds a threshold voltage $V_{c1}$ in block S430, if so a primary power supply enable signal may be output in block S432. The signal remains ON, as long as the $V_{IN\_RECT}$ remains greater than a second threshold voltage $V_{c2}$, as determined in block S434. If $V_{IN\_RECT}$ falls below the second threshold voltage $V_{c2}$, the primary power supply enable signal may be inhibited in block S436, thus also inhibiting primary power supply 12.

As will be appreciated, the threshold voltages detected will depend on the detection method/circuit used, and the nature of the input voltage waveform.

Conveniently then, detection circuit 24 is able to detect a variety of input voltage waveforms to ensure that they can provide an input voltage, that over time, allow for proper operation of primary power supply 12, preventing malfunction and/or damage resulting to power supply 12, or downstream components from under-voltage. As will be appreciated, other detectors could be added to detection circuit, to detect other applied voltage waveforms.

Of course, the above described embodiments are intended to be illustrative only and in no way limiting. The described embodiments are susceptible to many modifications of form, arrangement of parts, details, and order of operation. The invention, rather, is defined by the appended claims.

What is claimed is:

1. A power supply circuit comprising
   a primary power supply for providing an output voltage from an input voltage;
   a protection circuit interconnected with said input voltage, said protection circuit comprising
      a detection circuit to detect whether a magnitude of said input voltage is below a defined threshold, said detection circuit comprising a plurality of detectors each for detecting for a defined voltage waveform, whether its magnitude is below a defined threshold voltage; and
      logic interconnected with said detection circuit to provide a control signal for inhibiting said primary power supply from providing said output voltage if said input voltage is below said defined threshold, as detected by said detection circuit.

2. The power supply circuit of claim 1, further comprising an auxiliary power supply to provide operating power to active components of said protection circuit.

3. The power supply circuit of claim 2, wherein said auxiliary power supply provides an operating voltage from said input voltage to said protection circuit that is significantly lower than said output voltage.

4. The power supply circuit of claim 3, wherein said auxiliary power supply comprises a switching power supply.

5. The power supply circuit of claim 2, wherein said plurality of detectors comprises a detector for detecting at least one of a DC voltage, a sinusoidal voltage, and a modified sine-wave voltage waveform.

6. The power supply circuit of claim 1, further comprising a rectifier, for rectifying said input voltage, prior to providing said input voltage to said detection circuit.

7. The power supply circuit of claim 6, further comprising a filter.

8. The power supply circuit of claim 1, wherein each of said plurality of detectors comprises a comparator.

9. The power supply circuit of claim 8, wherein said logic comprises at least one OR-gate logically OR-ing an output of each of said plurality of detectors.

10. The power supply circuit of claim 1, wherein said detection circuit comprises a processor to digitize said input voltage to determine its waveform and to assess whether a measure of said waveform is below a defined threshold.

11. A method of operating a power supply circuit comprising a primary power supply and an auxiliary power supply, said method comprising:
    receiving an input voltage;
    using at least one active component powered by said auxiliary power supply to detect for a plurality of defined input voltage waveforms, whether a measure of said input voltage is below a defined threshold; and
    providing from said at least one active component a control signal for inhibiting a primary power supply from providing said output voltage if said input voltage is below said threshold, as detected by said at least one active component.

12. The method of claim 11, wherein said at least one active component comprises at least one analog comparator.

13. The method of claim 11, wherein said at least one active component comprises a processor.

14. The method of claim 11, further comprising determining the waveform of said input voltage.

\* \* \* \* \*